United States Patent
Johnson

(10) Patent No.: US 7,638,366 B2
(45) Date of Patent: Dec. 29, 2009

(54) METHODS AND APPARATUS FOR ADDITION OF ELECTRICAL CONDUCTORS TO PREVIOUSLY FABRICATED DEVICE

(75) Inventor: Morgan T. Johnson, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 299 days.

(21) Appl. No.: 11/339,102

(22) Filed: Jan. 23, 2006

(65) Prior Publication Data

US 2006/0121648 A1 Jun. 8, 2006

Related U.S. Application Data

(62) Division of application No. 10/370,393, filed on Feb. 19, 2003, now Pat. No. 6,991,969.

(51) Int. Cl.
   *H01L 21/00* (2006.01)
(52) U.S. Cl. ............... 438/113; 438/462; 257/E21.602
(58) Field of Classification Search ................. 438/113, 438/460–465
   See application file for complete search history.

(56) References Cited

U.S. PATENT DOCUMENTS

| 5,346,861 | A | * | 9/1994 | Khandros et al. | ............. 438/15 |
|---|---|---|---|---|---|
| 5,612,576 | A | * | 3/1997 | Wilson et al. | ............... 257/788 |
| 6,417,029 | B1 | * | 7/2002 | Fjelstad | ....................... 438/126 |
| 6,730,541 | B2 | * | 5/2004 | Heinen et al. | ............... 438/108 |
| 6,991,969 | B2 | * | 1/2006 | Johnson | ....................... 438/125 |
| 7,282,931 | B2 | * | 10/2007 | Johnson | ....................... 324/754 |
| 2001/0044197 | A1 | * | 11/2001 | Heinen et al. | ............... 438/612 |

* cited by examiner

Primary Examiner—David A Zarneke
(74) Attorney, Agent, or Firm—Raymond J. Werner

(57) ABSTRACT

A conductor carrier provides, separately manufactured, conductive pathways, on a wafer level, which may be coupled to a wafer of fully fabricated integrated circuits. Such conductor carriers include an insulating body having two major surfaces with conductors disposed on each of those surfaces, and conductors disposed within the insulating body so as to provide signal continuity between various conductors on each of the two surfaces. An assembly can be formed by permanently or removably attaching the conductor carrier to the wafer. Conductor carriers may include an evacuation pathway suitable for removing air, or other gases, from between the conductor and the wafer so as to create a pressure differential that urges the conductor carrier into contact with the wafer. Conductor carriers may include a groove which is suitable for receiving a sealing ring; and may include a street map which is suitable for providing guidance to a wafer sawing operation.

15 Claims, 5 Drawing Sheets

METHODS AND APPARATUS FOR ADDITION OF ELECTRICAL CONDUCTORS TO PREVIOUSLY FABRICATED DEVICE

CROSS-REFERENCE TO RELATED APPLICATIONS

This is a divisional application of previously filed application Ser. No. 10/370,393; entitled, "Methods and Apparatus For Addition of Electrical Conductors To Previously Fabricated Device", which was filed 19 Feb. 2003 now U.S. Pat. No. 6,991,969.

FIELD OF THE INVENTION

The present invention relates generally to manufacturing and assembly of electronic devices, and more particularly relates to methods and apparatus for providing additional electrical conductors for an integrated circuit, a microelectromechanical device, or similar structures, subsequent to the manufacture of thereof.

BACKGROUND

Integrated circuit manufacturing provides a substantial portion of the electronic components in use today. Although there are many different manufacturing processes for producing a finished integrated circuit, almost all of these processes have certain aspects in common. For example, it is common to fabricate integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits.

In conventional integrated circuit manufacturing processes it is common for terminals, such as those mentioned above to be brought into contact with probes for testing, and further to be contacted with bond wires or solder bumps for connection of the integrated circuit to a package, board, or similar environment.

Conventional integrated circuit manufacturing processes, typically produce fixed electrically conductive pathways, in the form of lines of metal, metal alloys, or metal laminate stacks. Generally these metal lines unchangeable by the time a wafer is ready for testing and assembly. Although, it is noted that, it is known to make minor changes to the fixed interconnect pattern subsequent to the conventional manufacturing process by means such as laser editing, fuse blowing, or focused ion beam cutting or deposition. However, these methods are not suitable for making any large scale changes to the fixed interconnect pathways of individual integrated circuits, and certainly are not suitable for making such changes to a large number of integrated circuits as would be found in a manufacturing environment.

SUMMARY OF THE INVENTION

Figure 1:
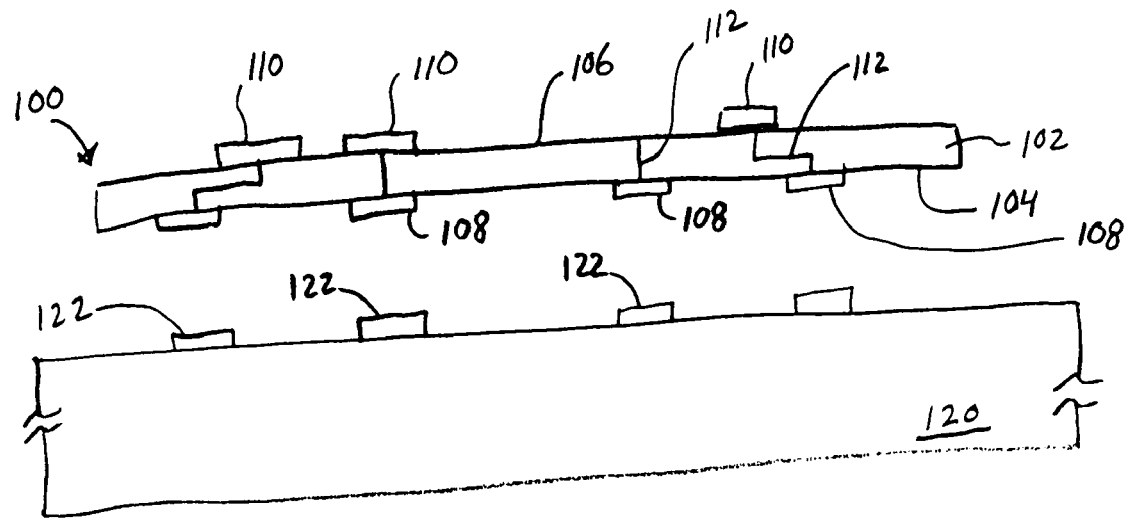
FIG. 1 is a schematic cross-sectional view of a wafer having a plurality of fabricated integrated circuits thereon, and a wafer-scale conductor carrier, in accordance with the present invention aligned for connection with the substrate.

Briefly, a conductor carrier in accordance with the present invention is a structure that provides additional conductive pathways, on a wafer level, which may be coupled to fully fabricated integrated circuits. Such a conductor carrier may comprise an insulating body having two major surfaces with conductors disposed on each of the two major surfaces, and conductors disposed within the insulating body so as to provide signal continuity between various conductors on each of the two major surfaces. An assembly can be formed from the wafer, which includes integrated circuits, and the separately manufactured conductor carrier. In such an assembly the conductor carrier may be permanently or removably attached to the wafer.

In a further aspect, such conductor carriers may include an evacuation pathway suitable for removing air, or other ambient gases, from between the conductor and the wafer so as to create a pressure differential that urges the conductor carrier into contact with the wafer.

In a still further aspect, such conductor carriers may include a groove which is suitable for receiving a sealing ring.

In a still further aspect, such conductor carriers may include a street map which is suitable for providing guidance to a wafer sawing operation.

DETAILED DESCRIPTION

It would be desirable to provide methods and apparatus for providing one or more conductive structures, which are manufactured separately from the wafers, in electrical contact with the one or more conductive structures of the integrated circuits on a wafer, subsequent to the manufacturing of the integrated circuits disposed on that wafer.

Various embodiments of the present invention provide, on a wafer level, a facility for adding additional interconnections to fully fabricated integrated circuits. Conductor carriers in accordance with the present invention may be permanently, or removably attached to a wafer containing a number of fabricated integrated circuits.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Substrate, as used herein, refers to the physical object which is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

Contact pads refer to regions of conductive material, typically a metal, metal alloy, or stack structure including several layers of metals and/or metal alloys, that are present, typically, at the uppermost layer of conductive material of an integrated circuit. Such pads are also sometimes referred to as bonding pads, or chip pads, and these terms are well understood in the integrated circuit industry. Contact pads are terminals which provide for electrical connection to be made between the integrated circuit and external devices.

In an alternative method of providing electrical connections to devices external to the integrated circuit, gold bumps, solder bumps, or solder balls, are used rather than the contact pads described above. It is noted that either contact pads, gold bumps, solder bumps, solder balls, or any other form of terminal suitable for external connection that is disposed on integrated circuits can be used with various embodiments of the present invention.

The expressions, laser cutting, laser editing, laser etching, laser machining, laser micro-machining, laser processing, laser scribing, and similar terms and expressions are sometimes used interchangeably. As used herein, these expressions refer to a process of removing material from a workpiece by exposing that workpiece to the output of a laser.

The Apparatus

Figure 2:
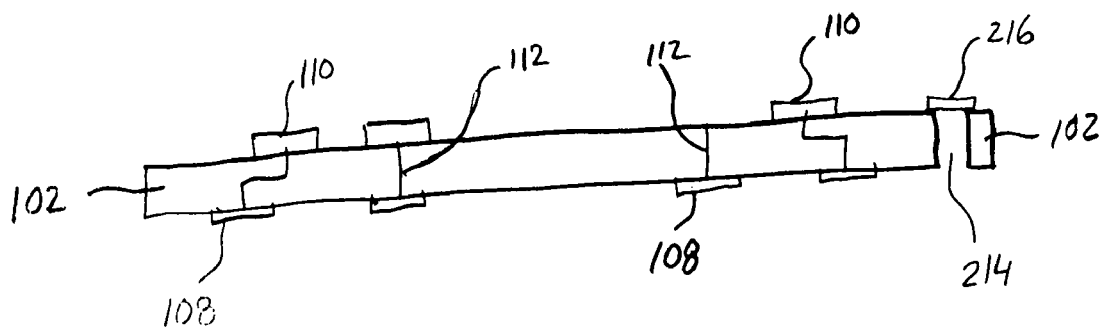
FIG. 2 is a schematic cross-sectional view of a wafer-scale conductor carrier illustrating an evacuation pathway in accordance with the present invention.

Referring to FIGS. 1 and 2, an exemplary apparatus 100 for adding post-fabrication conductors to one or more unsingulated integrated circuits in accordance with the present invention is shown. Apparatus typically includes an electrically insulating body 102 having a first major surface 104, and a second major surface 106. Apparatus 100 may be referred to as a conductor carrier. Insulating body 102 can be made from any thin, flexible dielectric material upon which a conductive material will adhere. A first plurality of electrical contacts 108 is disposed on first major surface 104 of body 102. In some embodiments of apparatus 100, each of the first plurality of electrical contacts 108 has a thickness which is less than a first thickness, and an area less than a first area. Similarly, a second plurality of electrical contacts 110 is disposed on the second major surface 106 of body 102. In some embodiments of conductor carrier 100, each of the second plurality of electrical contacts 110 has a thickness greater than a second thickness, and an area greater than a second area. It is noted that although the illustrative embodiment of FIG. 1 is show with electrical contacts 110, it is within the scope of the present invention to provide electrical pathways as well, so that the placement, or arrangement of electrical contacts 110 are not restricted to any particular location on conductor carrier 100.

It is noted the electrical pathways and contacts may be made from metal, metal alloys, or any other suitable material for carrying a signal, such as, but not limited to, electrically conductive polymers. Gold, nickel plated copper, and conductive elastomers are examples of materials suitable for forming the electrical contacts and pathways.

Conductor carrier 100 further includes a plurality of electrical vias 112 disposed in body 102, between first major surface 104 and second major surface 106 so as to provide electrically conductive paths between at least a portion of the first plurality electrical contacts 108 and a corresponding portion of the second plurality of electrical contacts 110. In the illustrative embodiment of FIGS. 1 and 2, conductor carrier 100 further includes an evacuation pathway 114 disposed in electrically insulating body 102, and an evacuation pathway sealing means 216 coupled to evacuation pathway 214. In the illustrative embodiment, evacuation pathway sealing means 216 is adapted for connection to a pressure differential source (not shown). It is noted that a pressure differential source may be a vacuum source. Attachment by this means may be referred to as vacuum attaching. It is further noted that evacuation sealing means 216 may be a mechanical valve. In one illustrative embodiment the valve is a built-in flapper valve. Alternatively, evacuation sealing means 216 may be an adhesive tape. In some embodiments of the present invention which use an adhesive tape as evacuation sealing means 216, the adhesive tape may be removably attachable.

As can be seen in the figures, vias 112 need not have pathways that are solely perpendicular to major surfaces 104, 106. In fact, as indicated in the figures by at least some vias 112 having at least a portion of their paths in a direction of travel that is parallel to major surfaces 104, 106, conductor carrier 100 may have one or more intermediate layers of conductive interconnect lines.

It is noted that more than one evacuation pathway may be present in a conductor carrier. Further, in those instances where a plurality of evacuation pathways are present in a conductor carrier, more than one evacuation pathway may be employed in evacuating air, or other gases, from between the conductor carrier and the wafer.

In an alternative embodiment, a membrane pump, rather than a pressure differential source, may be used in connection with evacuation pathway 214. Such a membrane pump is known to operate by means of preferentially passing in one direction, the gas or gases to be removed. In one embodiment of the present invention which utilizes the membrane pump, an inert gas such as, but not limited to nitrogen, is introduced into the space between the wafer and the conductor carrier. In one embodiment of the present invention, the inert gas is introduced at a pressure that is less than atmospheric pressure. This can be used as a maintenance feature by which undesired atmospheric components are preferentially kept out of the space between the wafer and the conductor carrier, and/or lower pressure is maintained.

Conductor carrier 100 is adapted for attachment to a substrate such as wafer 120 shown in FIG. 1. It is noted that the conductor carrier is typically thinner than the wafer to which it will be attached. It is further noted that conductor carrier 100 typically has an outer perimeter that fits within an outer perimeter of wafer 120 when conductor carrier 100 is centered over wafer 120. A plurality of electrical contacts 122 of various integrated circuits disposed on wafer 120 are also illustrated in FIG. 1. It can be seen that conductor carrier 100 and wafer 120 have been aligned so that when attached, the electrical contacts may be appropriately made. FIG. 1 also illustrates an embodiment of the present invention in which conductor carrier 100 has a diameter that is less than that of wafer 120. The assembly formed by the attachment, either permanent or removable, of the conductor carrier to the wafer, may be used in various operations in which the wafer alone normally participates. By way of example, and not limitation, the assembly may be used for burn-in, wafer probe (i.e., the testing of integrated circuits while still in wafer form), and general wafer transportation and wafer handling. That is, for many purposes, the assembly comprising the wafer and the attached conductor carrier, may be treated in the same manner as a wafer. The wafer effectively provides support for the conductor carrier.

Figure 3:
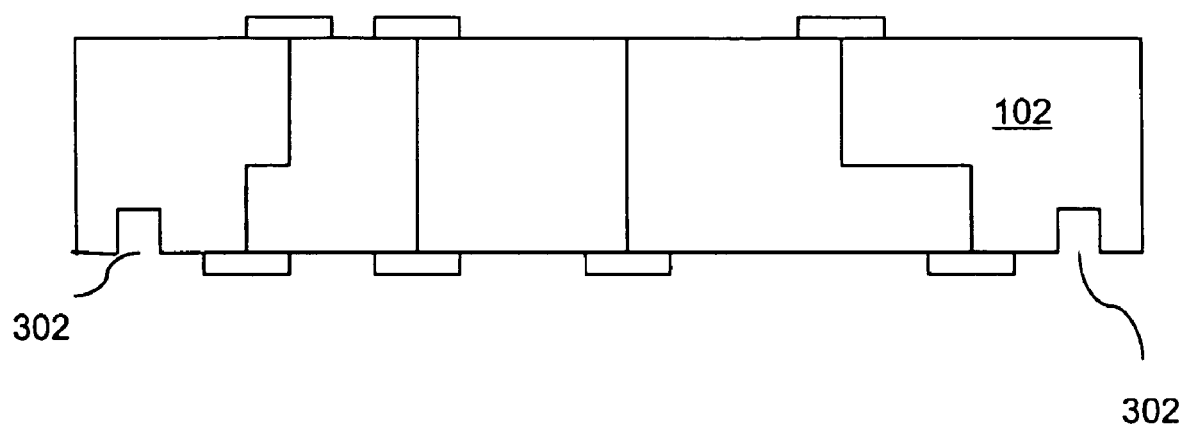
FIG. 3 is a schematic cross-sectional view of a wafer-scale conductor carrier showing a circumferential groove suited for receiving a sealing ring.

Referring to FIG. 3, a schematic cross-sectional view of a wafer-scale conductor carrier 100 shows a circumferential groove 302 suited for receiving a sealing ring. A sealing ring may be an O-ring. In one embodiment of the present invention, the O-ring may be seated in groove 302 prior to the attachment of conductor carrier 100 to the wafer.

Alternatively, the sealing ring may be formed of a material (e.g., a silicone gel) such that a substantially air-tight seal is formed when the air, or other gas, is partly or completely removed from between conductor carrier 100 and the wafer. It is desirable that a sealing ring material of this type have a set of characteristics such that the material does not adversely impact the operational, or functional, aspects of any of the integrated circuits of the wafer. For example, a low ionic concentration silicone that is specifically made for direct wafer contact without adhesion. That is, it is preferable for the adherence of the silicone to the conductor carrier be greater than the adherence of the silicone to the wafer.

In alternative configurations of the present invention, a sealing gasket may be disposed between the conductor carrier and the wafer without the a groove being present in the conductor carrier to receive the sealing gasket.

Figure 4:
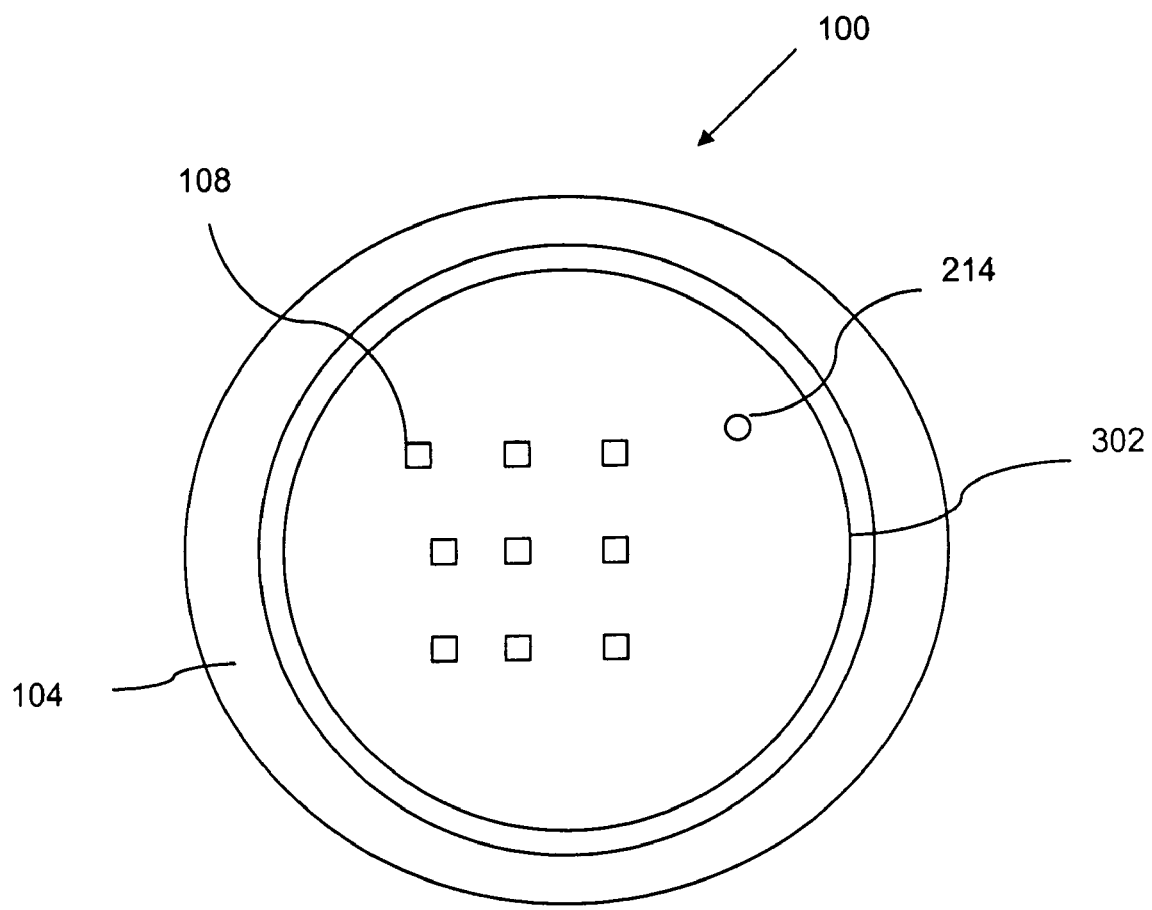
FIG. 4 is a schematic bottom view of a wafer-scale conductor carrier illustrating a circumferential groove, placement of an evacuation pathway port, and an array of bottom-side contact sites.

Referring to FIG. 4, a schematic bottom view of conductor carrier 100 is presented which generally shows first major surface 104, and more particularly shows circumferential groove 302, a port of evacuation pathway 214, and an array of bottom-side electrical contacts 108. The array of bottom-side electrical contacts are typically arranged so as to correspond to the physical layout of the electrical terminals of the wafer with which contact is to be made.

Figure 5:
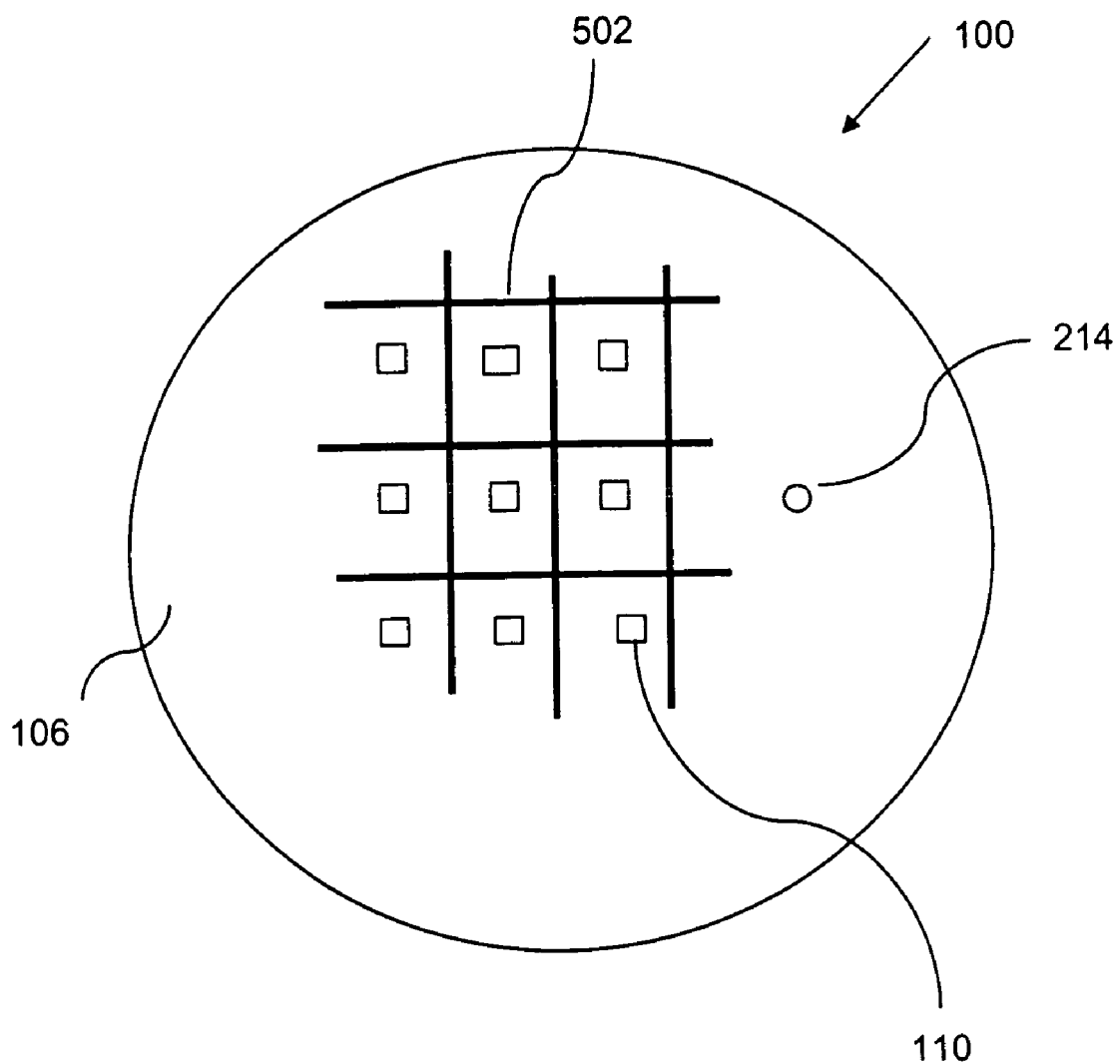
FIG. 5 is schematic top view of a wafer-scale conductor carrier illustrating placement of an evacuation pathway port, an array of top-side contact sites, and a street map suitable for providing guidance to a wafer sawing operation.

Referring to FIG. 5, a schematic top view of conductor carrier 100 is presented which generally shows second major surface 106, and more particularly shows a port of evacuation pathway 214, an array of top-side electrical contact 110, and a street map 502 suitable for providing guidance to a wafer sawing operation. In conventional integrated circuit manufacturing processes, a space, or scribe street, is formed between each of the integrated circuits on the wafer. This space is sometimes referred to as a scribe channel, a scribe alley, a scribe lane, or a scribe street. Regardless of the name used, these spaces form the paths through which the wafer is cut, so as to singulate, or separate, the individual integrated circuits. The process of separating the individual integrated circuits from the wafer may be referred to as cutting, sawing, or scribing. In order to properly perform the process of separating, it is preferable that the scribe street be visible so that the cutting mechanism (i.e., saw, laser, etc.) may be properly aligned to the wafer. However, the scribe streets are not normally visible once a conductor carrier is attached to the wafer. To overcome this lack of visibility, the conductor carrier may be provided with a "street map" 502 to guide the separation, i.e., singulation, process. Street map 502 corresponds to the scribe streets of the wafer attached to the underside 104 of conductor carrier 100. Since conductor carrier 100 is aligned to the underlying wafer, a cutting, or sawing operation can be guided by the visible markings provided by conductor carrier 100. In this way, the wafer may be cut with the conductor carrier attached, thereby producing individual integrated circuits with additional layers of interconnect thereon.

In one embodiment of the present invention, street map 502 is formed of the same material as electrical contacts 110. In an alternative embodiment, street map 502 is formed by etching trenches into surface 106. In a still further embodiment, street map 502 is formed from ink, paint, or similarly observable marking materials.

Figure 6:
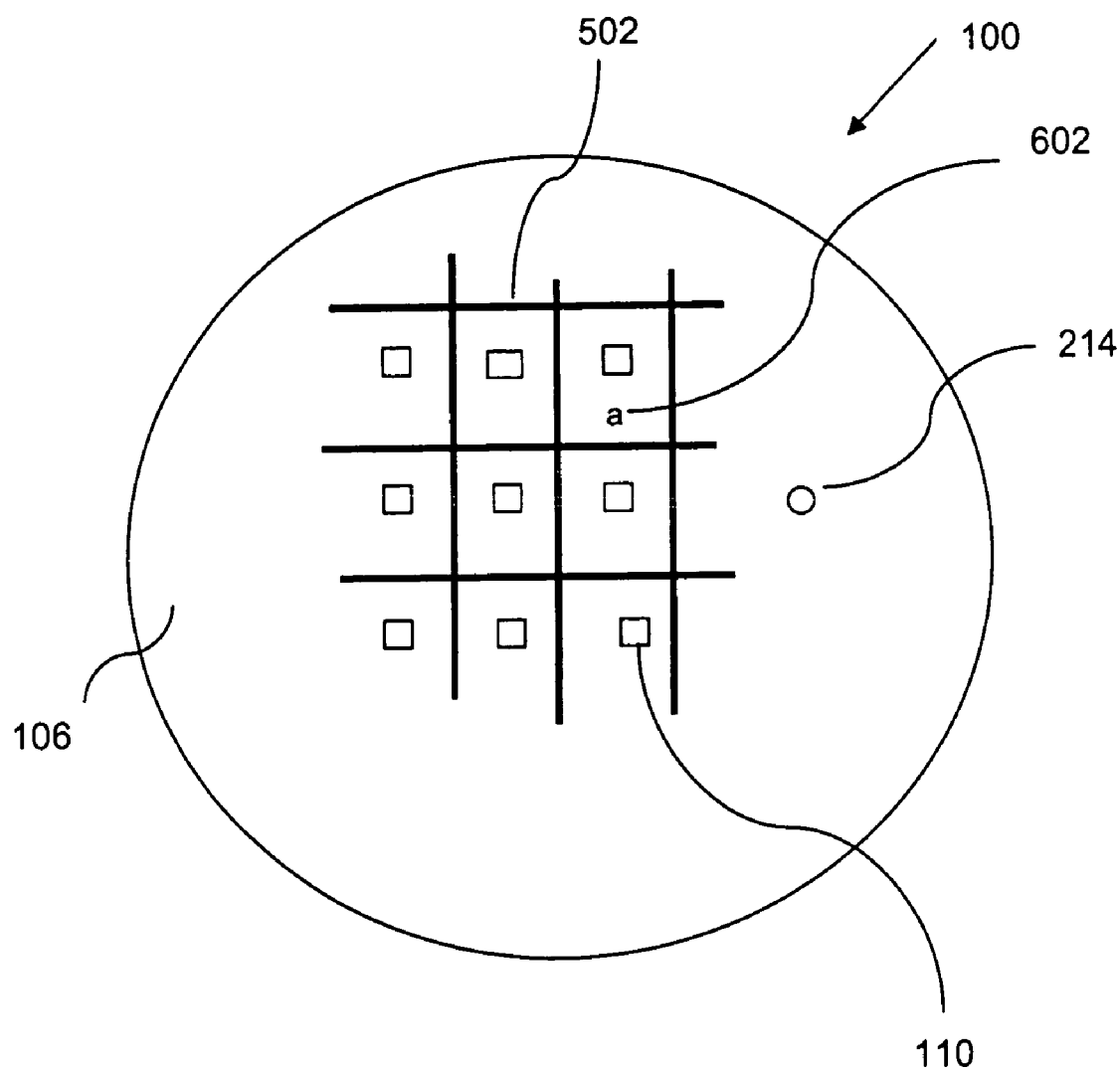
FIG. 6 is schematic top view of a wafer-scale conductor carrier illustrating placement of an evacuation pathway port, an array of top-side contact sites, a street map suitable for providing guidance to a wafer sawing operation, and observable information included at a location corresponding to the location of the information on a corresponding wafer.

In a manner similar to the formation of street map 502 on an upper surface of conductor carrier 100, other useful information may be provided so as to be observable on the upper surface of conductor carrier 100. For example, some integrated circuit manufacturing processes include marking individual integrated circuits with codes, or other such identifying information. Such marking may be done by laser scribing as is known in this field. In one embodiment of the present invention, the information that has been scribed, or otherwise formed, on integrated circuits of the wafer, is scanned, and reproduced on the upper surface of conductor carrier 100. In one embodiment, the positional integrity of the scanned information is maintained. In other words, the scanned information is rewritten at locations on the upper surface of conductor carrier 100 that correspond to the locations on the wafer from which the information was obtained. FIG. 6 illustrates the provision of information on the upper surface of conductor carrier 100. Referring to FIG. 6, information can be is shown as text 602.

As illustrated in FIGS. 4 and 5, typical embodiments of the present invention include conductor carriers that are substantially circular. By providing a shape that reflects that of the substrate to which it will be attached, embodiments of the present invention are well suited to provide connection to circuits throughout the underlying substrate. Those skilled in the art and having the benefit of the present disclosure will appreciate that conductor carriers in accordance with the present invention may have other shapes.

Alternative Arrangements

As described above in connection with FIGS. 2 and 3, a conductor carrier may be maintained in connection with a wafer through the establishment and maintenance of a pressure differential. In alternative embodiments of the present invention, a conductor carrier may be attached to the wafer, either permanently or removably, through the use of various adhesives. For a permanent attachment, a suitable adhesive is one which bonds the material of the conductor carrier to the wafer. Such an adhesive connection may be made between the wafer and the insulating portion of the conductor carrier, or between the wafer and a conductive portion of the conductor carrier. Similarly, a material which facilitates adhesion may be integrated into the conductor carrier, the wafer, or both. For a removable attachment, a suitable adhesive is one which bonds the material of the conductor carrier to the wafer, and which is dissolvable in a solvent that does not adversely affect the operational characteristics of the integrated circuits disposed on the wafer.

In a further alternative arrangement, an adhesive, or bonding, material used for attaching a conductor carrier to a wafer, may be heat or light activated. It is noted that such an adhesive, within the scope of the present invention, may also be deactivated by heat or light.

In a still further alternative arrangement, a conductor carrier is attached to a wafer by means of solder bumps disposed between the conductor carrier and the wafer. Bonding between the conductor carrier and the wafer may be achieved by heating the solder bumps with laser energy. A laser may be directed through the conductor carrier such that energy is deposited in a solder bump, or solder ball, disposed between a contact pad of the conductor carrier and a contact pad of the wafer. A plurality of such soldered contacts serves to bond the conductor carrier to the wafer.

CONCLUSION

Embodiments of the present invention find application in conjunction with integrated circuits and similar microelectronic devices such as, but not limited to, microelectromechanical systems.

Various embodiments of the present invention provide means for permanently or removably attaching additional interconnect lines to one or more fully fabricated integrated circuits, while those integrated circuits are still in wafer form.

An advantage of some embodiments of the present invention includes providing one or more electrically conductive pathways which can be coupled to one or more electrical terminals of two or more unsingulated integrated circuits.

A further advantage of some embodiments of the present invention is that the conductors provided by the conductor carrier may be thicker, or of a different material, than is possible to provide on the integrated circuit itself.

It is noted that many alternative embodiments in accordance with the present invention are possible. In one such alternative, the pathways provided by embodiments of the present invention are optical pathways rather than electrical pathways. Other alternative may include both electrical and optical pathways.

It is to be understood that the present invention is not limited to the embodiments described above, but encompasses any and all embodiments within the scope of the subjoined Claims and their equivalents.

What is claimed is:

1. A method of providing additional conductive pathways to a plurality of integrated circuits, each integrated circuit having a plurality of terminals, the method comprising:
   providing a wafer having a first and a second major surface, the plurality of integrated circuits disposed on a first major surface thereof, each of the plurality of integrated circuits having a plurality of terminals arranged in a common layout, and the plurality of integrated circuits disposed in a repeating pattern over at least a portion of the first major surface;
   providing a conductor carrier having a first major surface and a second major surface, a first plurality of contact terminals disposed on the first major surface of the conductor carrier in a pattern that corresponds to the terminal layout of the plurality of integrated circuits;
   providing a street map on the second major surface of the conductor carrier; and
   attaching the conductor carrier to the wafer such that the first major surface of the wafer and the first major surface of the conductor carrier are facing each other, and such that at least a portion of the terminals of the integrated circuits are in electrical contact with the first plurality of contact terminals;
   wherein each of the first plurality of contact terminals is electrically coupled to a corresponding one of a second plurality of contact terminals disposed on the second major surface of the conductor carrier.

2. The method of claim 1, wherein attaching comprises, providing laser energy to effect at least partial melting of solder bumps disposed between the terminals of the integrated circuits and the terminals of the conductor carrier.

3. The method of claim 1, wherein the integrated circuit terminals comprise bonding pads.

4. The method of claim 1, further comprising aligning the conductor carrier to the wafer such that the terminals of the integrated circuits and the terminals disposed on the first major surface of the conductor carrier will be in electrical contact when the conductor carrier is attached to the wafer.

5. The method of claim 1, further comprising singulating the integrated circuits through the conductor carrier in accordance with the street map.

6. The method of claim 1, wherein the street map comprises one or more trenches in the second major surface of the conductor carrier.

7. The method of claim 1, wherein the street map comprises ink.

8. The method of claim 1, wherein the street map comprises paint.

9. The method of claim 1, wherein the second plurality of contact terminals are comprised of an electrically conductive material; and the street map is comprised of the same material as the second plurality of contact terminals.

10. The method of claim 1, further comprising reproducing on the second major surface of the conductor carrier observable information that was formed on the first major surface of the wafer.

11. The method of claim 10, wherein the positional integrity of observable information is maintained between the first major surface of the wafer and the second major surface of the conductor carrier.

12. The method of claim 10, wherein the observable information comprises text.

13. The method of claim 10, wherein reproducing the observable information comprises laser scribing.

14. The method of claim 10, wherein the observable information comprises identifying information.

15. The method of claim 10, further comprising, prior to reproducing the observable information, scanning the wafer to obtain the observable information.

* * * * *